United States Patent

Cram et al.

[19]

[11] Patent Number: 5,963,953
[45] Date of Patent: Oct. 5, 1999

[54] METHOD, AND SYSTEM FOR PRODUCT CONFIGURATION

[75] Inventors: Robert Cram, San Francisco; Ming-Tao Liou, Fremont; Christopher Stauber, Castro Valley, all of Calif.

[73] Assignee: Siebel Systems, Inc., San Mateo, Calif.

[21] Appl. No.: 09/050,749

[22] Filed: Mar. 30, 1998

[51] Int. Cl.[6] .................................................. G06F 17/00
[52] U.S. Cl. ........................................ 707/102; 707/100
[58] Field of Search ............................ 382/156; 364/489; 345/333, 420; 395/500, 701; 705/29; 707/100

[56] References Cited

U.S. PATENT DOCUMENTS

| | | | |
|---|---|---|---|
| 5,123,057 | 6/1992 | Verly et al. | 382/156 |
| 5,267,346 | 11/1993 | Maruyama et al. | 706/62 |
| 5,307,261 | 4/1994 | Maki et al. | 705/29 |
| 5,515,269 | 5/1996 | Willis et al. | 705/29 |
| 5,544,067 | 8/1996 | Rostoker et al. | 364/489 |
| 5,581,672 | 12/1996 | Letcher, Jr. | 345/420 |
| 5,617,510 | 4/1997 | Keyrouz et al. | 706/45 |
| 5,675,784 | 10/1997 | Maxwell et al. | 707/100 |
| 5,708,798 | 1/1998 | Lynch et al. | 395/500 |
| 5,710,896 | 1/1998 | Seidl | 345/333 |
| 5,740,425 | 4/1998 | Povilus | 707/100 |
| 5,745,765 | 4/1998 | Paseman | 395/701 |

*Primary Examiner*—Wayne Amsbury
*Assistant Examiner*—Thuy Pardo
*Attorney, Agent, or Firm*—Richard M. Goldman; Cooley Godward LLP

[57] ABSTRACT

A method of configuring a complex composite product a: from a partial composite product and an enumeration of unsatisfied requirements of the complex composite product, said complex composite product being subject to rules.

16 Claims, 1 Drawing Sheet

METHOD, AND SYSTEM FOR PRODUCT CONFIGURATION

FIELD OF THE INVENTION

This invention relates to product configurators, and especially to product configurators integrated with data base systems and with order entry systems.

BACKGROUND OF THE INVENTION

Problems in configuring complex systems arise from the sheer complexity of the systems. That is, the inclusion of one component or sub-system may mandate the inclusion of other sub-systems and components, as well as the exclusion of still other sub-systems and components. For example, in the case of preparing a quotation for a new automobile, the inclusion of, e.g., a traction control module, may require the inclusion of one sub-set of engines, while precluding the inclusion of another sub-set of engines, for example, for technical or performance reasons. Similarly, the selection of one color may preclude the selection of certain upholstery combinations, for example, for reasons of inventory or availability. Of course, if you don't select an engine and a transmission, you don't have an automobile. Certain choices must be made. The problem is one of "If you pick 'X', you must also pick 'Y' and 'Z', but if you pick 'Y', you can not get 'A' or 'B', and you have already selected 'A'." That is, selection of one component or sub-system may remove some previously selected components or sub-systems from the system.

As systems become more complex, with more components and sub-systems, and more choices, and as the choices become limited because of "rules", that is, governmental regulations, industry standards, business policies, sales policies, inventory conditions, vendor relationships, and production scheduling, among others, it is difficult for the unassisted configuration specialist or sales professional to quickly develop a valid product configuration for a complete complex system.

Thus, a need exists for a tool, system, and method to enable configuration specialists, as sales professionals and design engineers, to effectively configure complex systems in the context of many choices, options, and rules, including frequently inconsistent and conflicting rules.

There is a further need to configure these complex systems from a set of unsatisfied requirements.

There is still a further need to configure these complex systems in the context of rules that mandate the removal of previously selected components or sub-systems because of new selections, in which case selecting a component or sub-system may completely transform the set of selected components and sub-systems, and the set of unsatisfied requirements.

There is a still further need for a method and system of selecting sub-systems and components against an objective.

OBJECTS OF THE INVENTION

It is an object of our invention to provide a tool, system, and method to enable configuration specialists, as sales professionals and design engineers, to effectively configure complex systems in the context of many options, choices, and rules, including inconsistent and conflicting rules.

It is a further object of our invention to provide a tool, system, and method to configure these complex systems from a set of unsatisfied requirements.

It is still further object of our invention to provide a tool, system, and method to configure these complex systems in the context of rules that mandate the removal of previously selected components or sub-systems because of new selections, in which case selecting a component or sub-system may completely transform the set of selected components and sub-systems, and the set of unsatisfied requirements.

It is a still further object of our invention to provide a tool, method, and system of selecting sub-systems and components against an objective, i.e., minimum cost, maximum capability or availability, minimum delivery time, and the like.

SUMMARY OF THE INVENTION

These and other objects are achieved by the method and system of our invention. According to our invention we provide a tool, a system, and a method to enable configuration specialists, as sales professionals and design engineers, to effectively configure complex systems in the context of rules. The tool, system, and method to configure these complex systems from a set of unsatisfied requirements, for example, in the context of rules that mandate the removal of previously selected components or sub-systems because of new selections, in which case selecting a component or sub-system may completely transform the set of selected components and sub-systems, and the set of unsatisfied requirements. The tool, method, and system of our invention can select sub-systems and components for inclusion or removal against an objective.

The method of our invention starts from a partial configuration, for example default configuration or a configuration of the bare minimum of customer requirements. The tool, method, and system of our invention proceeds with ordering the enumeration of unsatisfied requirements. This is followed by choosing an item, and in a preferred exemplification, the first item, in the ordered list of unsatisfied requirements. Selection of the item, for example, the first item, in the ordered list is followed by the recursive steps within the selected item of the ordered list of first determining if there is a list of subordinate unsatisfied requirements, and if a subordinate list of unsatisfied requirements exists, recursively returning to the step of choosing a new unsatisfied requirement in the re-ordered list of unsatisfied requirements. If no subordinate lists of unsatisfied requirements exists, components are matched to currently unsatisfied requirement to create a list of components, and the lists of components are ordered. This matching is followed by ordering, for example, re-ordering the lists of components, and changing the quantity of components ordered to satisfy the unsatisfied requirement for the component. The loop is closed by either ordering the enumeration of unsatisfied requirements, or by exiting, that is, the configuration is completed.

As used herein, the following terms have the following meanings:

A "complete composite product" is a set of products, features, components, or parts, that together satisfy some rules about compatibility, requirements, and sufficiency, as described in a configuration model. In other words, these parts go together, they possibly require one another, and when together, they don't require any other part or additional or reduced quantity of existing part, in order to be considered completely salesworthy or manufacturable. A complete composite product is often stored as, or is converted to, a valid sales quote, valid order, valid customer inquiry, valid manufacturing bill of materials, or other similar entity.

A "partial composite product" is a set of some separate products, features, components, or parts, that together don't violate any rules about compatibility, but which together may not satisfy all rules about requirements or sufficiency. This set is a subset of possibly many (even infinitely numbered) complete composite product. In other words, the parts of a partial composite product go together, but they may not be complete. A partial composite product may be the empty set, or it may be a complete composite product.

A "configuration model" is a description of a set of products, features, components, or parts, and a description of some relations among those parts. Those relations may include compatibilities, incompatibilities, requirements, numerical relations among some properties of the parts, etc. Configuration models may be of any complexity, and some quantities in some models may be unconstrained. Therefore, for any configuration model, there may exist an infinite number of valid complete composite products, an infinite number of partial composite products, and an infinite number of invalid composite products. The problem solved by this invention is the arrival at one of these (possibly infinitely numbered) complete composite products from one of these (possibly infinitely numbered) partial composite products, according to the preference established and recorded in a database or other storage by a product expert.

The word "order" is used throughout this document, generally in the sense related to the word "ordinal", not in the sense related to an instruction or request to purchase.

One aspect of our invention is that it has the capability of significantly reducing the time it takes for customer configuration specialists to create a custom configuration, such as for sales professionals to complete sales quotations. In a preferred embodiment of our invention this custom configuration feature is available through a right-click menu or an Action menu.

Configuring a complete composite product, as defined above, is a complex problem, especially in the face of external restraints and rules. For example, sales professionals are tasked with creating quotations for their customers for an increasingly broad and complex array of products and services. They must configure the complete composite products and services in the face of frequently inconsistent or even conflicting marketing policies, corporate rules, engineering constraints, and government regulations. This is to ensure that the resulting complete composite product or service being offered by the sales professional is even available for sale, that it can be built and delivered (based on inventory or vendor commitments), and that offering the complete composite product or service for sale is not illegal. Equally important, in preparing the quote on the complete composite product or service, the sales professional must be careful to include all of the products, options, and services that are required, and not forget to include anything.

At the same time, the product or service configuration specialist, for example, the sales professional or design engineer, must, try to configure the complete composite product so that the customer's needs are well met by selecting the products and services that the customer has requested, along with those that are required in order to complete the "solution" with a working product. Efficiently creating the solution, or complete set of products and services that are configured to meet the customer's requirements and that meet all of the policy and regulatory requirements, is the goal of the product configuration specialists, for example, the sales professional or design engineer.

The configuration management method and system of our aids the configuration professional, for example, the sales professional or design engineer, in this process, by organizing the alternatives, for example, the product catalog, and indicating which candidate solutions and items are unavailable, and why, as the configuration specialist builds the solution. In this way, the configuration specialist, such as the sales professional or design engineer, can focus on choosing those items that are required by the customer, and rely on the system and method of our invention to ensure that incompatible or proscribed items are not selected.

Once the configuration specialist has selected items for inclusion in the complete composite product, there may be a requirement for other, complimentary, selections due to engineering rules, or corporate policy, as in the case of power converters required when 12 v components are selected for a 110 v device, or Maintenance Service required for a software product. The method and system of our invention provides the capability of automatically selecting all of the remaining required items for the configuration specialist, so that the solution can be completed quickly, effectively, and accurately, without requiring the configuration specialist, for example, a sales professional or design engineer, to choose each remaining item.

When the configuration specialist utilizes the method and system of our invention, the method and system navigates through a product catalog and selects the "preferred" item from each category where an unsatisfied requirement exists. This is done while respecting the rules and policies embodied in the product model, and choosing the best available item that will satisfy the open requirement.

The method and system of our invention allows the configuration specialist to create solutions more effectively. It can be used at any time during the quoting, configuration or design process to complete the solution using the rules embodied by the product model.

The first part of this invention enables a product expert—a marketing or engineering professional—to describe, and to cause to be stored in a database or other storage, a preferred method and selection order for creating a complete composite product from a partial composite product. The second part of the invention enables an executable program, when invoked either by a user or an automatic process, to identify the preferred method and selection order previously stored by the product expert, and then to use those preferences to create an actual complete composite product from an actual partial composite product.

THE FIGURE

The invention may be more clearly understood by reference to the FIGURE appended hereto.

FIG. 1 shows a simplified flow chart of the method of our invention, with ordering the enumeration of unsatisfied requirements (a), followed by choosing an item, for example the first item, in the ordered list of unsatisfied requirements (b). This is followed by the recursive steps within the selected item, e.g., the first item, of the ordered list (c) of first determining if there is a list of subordinate unsatisfied requirements, and if a subordinate list of unsatisfied requirements exists, recursively return to step b (c-1). In the next block, (c-2), if no subordinate lists of unsatisfied requirements exists, components are matched to currently unsatisfied requirement to create a list of components, and the lists of components are ordered (c-3). This matching is followed by ordering, for example, re-ordering the lists of components (c-3), and changing the quantity of components ordered in step c-3) to satisfy the unsatisfied requirement for the component. The loop is closed by either returning to step a if there remaining unsatisfied requirements, or exiting (d).

DETAILED DESCRIPTION OF THE INVENTION

Figure 1:
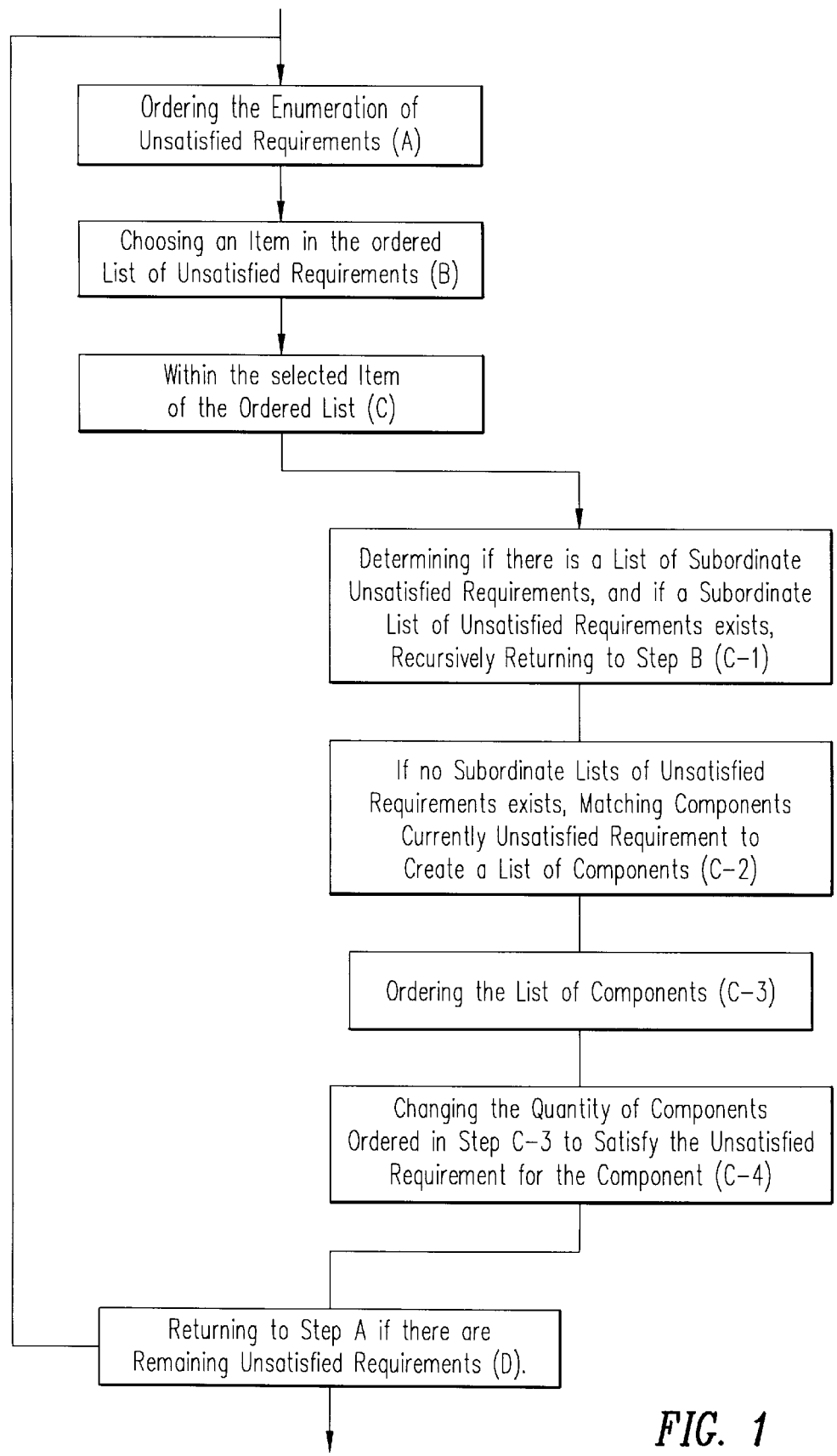

The method of our invention provides for the configuration of complete complex systems from partially configured, incomplete systems. This is accomplished in a recursive, iterative process, subject to rules. These rules may be market driven, regulatory, matters of design or engineering practice matters of business practice, inventory and/or supplier or vendor driven, or customer driven.

The General Algorithm

The method of our is illustrated in the FIGURE. The tool, method, and system of the invention starts from a partial configuration, for example default configuration or a configuration of the bare minimum of customer requirements. The tool, method, and system of our invention proceeds with ordering the enumeration of unsatisfied requirements (block a). This is followed by choosing an item, in a preferred exemplification the first item, in the ordered list of unsatisfied requirements (block b). Selection of the selected item, e.g., the first item, in the ordered list is followed by the recursive steps (block c) within selected item, e.g., the first item, of the ordered list of first determining if there is a list of subordinate unsatisfied requirements (block c-1), and if a subordinate list of unsatisfied requirements exists, recursively returning to the step of choosing a new unsatisfied requirement in the re-ordered list of unsatisfied requirements (block c-1). If no subordinate lists of unsatisfied requirements exists, components are matched to currently unsatisfied requirement to create a list of components (block c-2), and the lists of components are ordered (block c-3). This matching is followed by ordering, for example, re-ordering the lists of components, and changing the quantity of components ordered to satisfy the unsatisfied requirement for the component (block c-4). The loop is closed by either ordering the enumeration of unsatisfied requirements, or by exiting, that is, the configuration is completed (block d).

Programs that include this invention execute the following general algorithm:

First, a user or a software process uses a selection process, for example, in a software module, to create a partial composite product. The partial composite product would be a high level view of the final, complete, composite product. One example would be the use of a program to construct a sales quote or an initial configuration of activities and processes within a software program.

Next, the user or the software process communicates a request to complete a partial composite product, i.e. to create a complete composite product, that is, a product containing the components that are already in the partial composite product, as necessary to complete the product. This request is communicated to a module incorporating the method and system of our invention, for example, a configurator engine. The request is received by a module that contains the description of the configuration model A program that incorporates the system and method of our invention executes the following algorithm in order to complete the configuration of complete composite product:

First, identify or identify and enumerate the unsatisfied requirements to complete the configuration of the complete composite product. These are parts or other components whose quantities may be changed (possibly from zero to some non-zero quantity) in order to satisfy a requirement or measure of sufficiency in the model. This list is the result of the application of the configuration model to the partial composite product. The creation of an enumeration of unsatisfied requirements is a standard product configurator process. If the list of unsatisfied requirements is empty, that is, if there are no unsatisfied requirements, all of the requirements having been satisfied, the process is completed.

Next, if there are unsatisfied requirements, the unsatisfied requirements are ordered, and broken down into subordinate enumerations of unsatisfied requirements that are recursively ordered. The unsatisfied requirements are matched to components or parts, and removed from the enumeration of unsatisfied requirements thereby. That is, the quantity of the initial item in this ordered list of parts or components is changed, to satisfy the unsatisfied requirement. This change in quantity may be either of quantity plus or minus one (±1) or of some other calculated quantity.

The method and system of the invention then goes back identifying and ordering unsatisfied requirements. If no such unsatisfied requirements exist, the search is finished and the complete complex product is configured.

One embodiment of the method and system of our invention is illustrated by the following pseudo code, and shown in FIG. 1:

a Order the enumeration of unsatisfied requirements.
b Choose an item, in a preferred exemplification, the first item, in the ordered list of unsatisfied requirements.
c Within the selected item of the ordered list:
  i) Determine if there is a list of subordinate unsatisfied requirements, and if a subordinate list of unsatisfied requirements exists, recursively return to step b.
  ii) If no subordinate lists of unsatisfied requirements exists, match components currently unsatisfied requirement to create a list of components.
  iii) Order the list of components.
  iv) Change the quantity of components ordered in step iii) to satisfy the unsatisfied requirement for the component.
b Return to step a if there remaining unsatisfied requirements, otherwise exit.

Implementations of this invention store and use the product expert's preferences in these variants.

According to one exemplification of our invention, a database or file system stores the preferences and/or rules as a direct association of part plus ordering. This preference is recorded as <Part Identifier>+<Order>. These values may be stored in columns or fields within a larger record structure or row in a table. This might be called direct item ordering, In this implementation, a screen form exists for the user to enter into the database or file, an ordering number, per configuration item. In a subsequent step of the algorithm described above, the program queries a database for the <Order> information for each item in the list of unsatisfied requirements, sorts the resulting list, and identifies in step C, the first item in the resulting sorted list.

In another exemplification of the invention, a database or file system stores the preference as a formula or formula value, a reference to a property value, or a reference to a function. That is, the ordering of items might not be known when the product expert establishes the ordering. Rather, the product describes a function which may later (during execution of this invention's general algorithm) be executed. This creates a late binding of an ordering to each item, for use during the ordering part of the general algorithm. There may exist one formula for all items, or different formulas for different subsets of items in the model. In this implementation, a screen form exists for the user to enter a formula for all items, or a formula for each item. Later, in step b of the general algorithm, the program queries a database for the <Order Formula> information for each item in the list of unsatisfied requirements, executes the formula for each item (this step may include other calculations, database queries, etc.), associates a formula result with each item in the list, sorts the resulting list of "item+formula" results, and identifies in step C, the first item in the resulting sorted list.

In still a further exemplification of our invention, a database, file system, or program stores an identifier of a property that will be used to order the items in the configuration. For example, a product expert might decide to order the items so that the highest-margin product is first in the ordering used by the general algorithm. In this implementation, a screen form exists for the user to enter the identifier of this property. Later, in step b of the general algorithm, the program queries a database for the value of the property for each item in the list of unsatisfied requirements, associates this property value with each item in the list, sorts the resulting list of item+property value, and identifies in step C, the first item in the resulting sorted list.

In a still further embodiment of our invention, useful in the absence of a user-supplied ordering, the database or configuration engine provides an implicit ordering of the parts (alphabetic sorting of part names, for example).

In a still further exemplification of our invention we provide an article of manufacture having a computer usable medium having computer readable program code embodied therein for configuration a complex composite product from (1) a partial composite product and (2) an enumeration of unsatisfied requirements of the complex composite product. The configuring and configuration of the complex composite product is subject to rules and preferences. The computer readable program means in the article of manufacture has (a) computer readable program code for causing a computer to effect ordering the enumeration of unsatisfied requirements; (b) computer readable program code means for causing selection of a first item in the ordered list of unsatisfied requirements. The computer readable program code further includes program code for causing, within the selected item of the ordered list, i) determining if there is a list of subordinate unsatisfied requirements, and if a subordinate list of unsatisfied requirements exists, recursively returning to step b;

ii) if no subordinate lists of unsatisfied requirements exists, matching components currently unsatisfied requirement to create a list of components;

iii) ordering the list of components; and iv) changing the quantity of components ordered in step iii) to satisfy the unsatisfied requirement for the component.

The program product also includes computer readable program code for returning to enumeration of unsatisfied requirements if there are remaining unsatisfied requirements.

Our invention further includes a program storage device readable by a machine, e.g., a computer. The program storage device tangibly embodies a program of instructions executable by a machine, e.g., a computer, to perform method steps for configuring a complex composite product from a partial composite product and an enumeration of unsatisfied requirements of the complex composite product subject to rules and preferences. The method steps include.

a. ordering the enumeration of unsatisfied requirements;

b. choosing an item, in a preferred exemplification, the first item, in the ordered list of unsatisfied requirements;

c. within the first item of the ordered list:

i). determining if there is a list of subordinate unsatisfied requirements, and if a subordinate list of unsatisfied requirements exists, recursively returning to step b;

ii). if no subordinate lists of unsatisfied requirements exists, matching components currently unsatisfied requirement to create a list of components;

iii). ordering the list of components;

iv). changing the quantity of components ordered in step iii) to satisfy the unsatisfied requirement for the component; and d. returning to step a if there are remaining unsatisfied requirements.

While the invention has been described with respect to certain preferred embodiments and exemplifications, it is not intended to limit the scope of the invention thereby, but solely by the claims appended hereto.

We claim:

1. A method of configuring a complex composite product from a partial composite product and an enumeration of unsatisfied requirements of the complex composite product, said complex composite product being subject to rules, a ordering the enumeration of unsatisfied requirements;

b choosing an item in the ordered list of unsatisfied requirements;

c within the selected item of the ordered list:

i) determining if there is a list of subordinate unsatisfied requirements, and if a subordinate list of unsatisfied requirements exists, recursively returning to step b;

ii) if no subordinate lists of unsatisfied requirements exists, matching components currently unsatisfied requirement to create a list of components;

iii) ordering the list of components;

iv) changing the quantity of components ordered in step iii) to satisfy the unsatisfied requirement for the component; and b returning to step a if there are remaining unsatisfied requirements.

2. The method of claim 1 wherein the selected item is the first item.

3. The method of claim 1 comprising storing rules as a direct association of part plus ordering.

4. The method of claim 3 comprising storing the rules as <Part Identifier>+<Order>.

5. The method of claim 3 comprising storing the rules in columns or fields within a larger record structure or row in a table.

6. The method of claim 3 comprising providing a screen form for the user to enter into the database or file, an ordering number per configuration item.

7. The method of claim 3 comprising querying a database for the <Order> information for each item in the list of unsatisfied requirements, sorting the resulting list, and identifying the first item in the resulting sorted list.

8. The method of claim 1 comprising storing rules and preferences as one or more of a formula or formula value, a reference to a property value, or a reference to a function.

9. The method of claim 8 comprising late binding of an ordering to each item.

10. The method of claim 8 comprising querying a database for <Order Formula> information for each item in the list of unsatisfied requirements, executing the formula for each item, associating a formula result with each item in the list, sorting the resulting list of "item+formula" results, and identifying the first item in the resulting sorted list.

11. The method of claim 1 comprising storing in a database an identifier of a property used to order components or sub-systems in a complete complex system.

12. The method of claim 11 comprising querying the database for the value of the property of each item in the list of unsatisfied requirements, associating this property value with each item in the list, sorting the resulting list of item+property values, and identifying the first item in the sorted list.

13. An article of manufacture comprising: a computer usable medium having computer readable program code means embodied therein for causing configuration of a complex composite product from a partial composite product and an enumeration of unsatisfied requirements of the complex composite product, said complex composite product being subject to rules, the computer readable program means in said article of manufacture comprising:

a computer readable program code means for causing a computer to effect ordering the enumeration of unsatisfied requirements;

b computer readable program code means for causing selection of an item in the ordered list of unsatisfied requirements;

c computer readable program code means for causing, within the selected item of the ordered list:
  i) determining if there is a list of subordinate unsatisfied requirements, and if a subordinate list of unsatisfied requirements exists, recursively returning to step b;
  ii) if no subordinate lists of unsatisfied requirements exists, matching components currently unsatisfied requirement to create a list of components;
  iii) ordering the list of components;
  iv) changing the quantity of components ordered in step iii) to satisfy the unsatisfied requirement for the component; and d computer readable program code means returning to enumeration of unsatisfied requirements if there are remaining unsatisfied requirements.

14. The program product of claim 13 wherein the selected item is the first item.

15. A program storage device readable by a machine, tangibly embodying a program of instructions executable by a machine to perform method steps for configuring a complex composite product from a partial composite product and an enumeration of unsatisfied requirements of the complex composite product subject to rules and preferences said method steps comprising:

a ordering the enumeration of unsatisfied requirements;

b choosing an item in the ordered list of unsatisfied requirements;

c within the selected item of the ordered list:
  i) determining if there is a list of subordinate unsatisfied requirements, and if a subordinate list of unsatisfied requirements exists, recursively returning to step b;
  ii) if no subordinate lists of unsatisfied requirements exists, matching components currently unsatisfied requirement to create a list of components;
  iii) ordering the list of components;
  iv) changing the quantity of components ordered in step iii) to satisfy the unsatisfied requirement for the component; and d returning to step a if there are remaining unsatisfied requirements.

16. The program storage device of claim 15 wherein the selected item is the first item.

* * * * *